United States Patent [19]

Hileman

[11] Patent Number: 6,052,285

[45] Date of Patent: Apr. 18, 2000

[54] ELECTRONIC CARD WITH BLIND MATE HEAT PIPES

[75] Inventor: Vince P. Hileman, San Jose, Calif.

[73] Assignee: Sun Microsystems, Inc., Mountain View, Calif.

[21] Appl. No.: 09/172,555

[22] Filed: Oct. 14, 1998

[51] Int. Cl.⁷ ....................................................... H05K 7/20
[52] U.S. Cl. .......................... 361/699; 361/700; 361/701; 257/714; 257/715; 174/15.1; 174/15.2; 165/80.4
[58] Field of Search ..................................... 361/698–700, 361/701, 704, 719; 174/15.1, 15.2; 165/80.3, 80.4; 257/714, 715; 62/259.2

[56] References Cited

U.S. PATENT DOCUMENTS

| | | | |
|---|---|---|---|
| 5,343,358 | 8/1994 | Hilbrink | 361/700 |
| 5,365,749 | 11/1994 | Porter | 62/259.2 |
| 5,634,351 | 6/1997 | Larson et al. | 62/259.2 |
| 5,808,869 | 9/1998 | Donahoe et al. | 361/704 |

*Primary Examiner*—Leo P. Picard
*Assistant Examiner*—Boris L. Chervinsky
*Attorney, Agent, or Firm*—Blakely Sokoloff Taylor & Zafman

[57] ABSTRACT

An electronic assembly that includes a heat pipe that extends from an electronic card. The heat pipe has a condenser end that can be inserted into an elastic thermally conductive port of a manifold. The manifold may be part of a cooling system that removes heat from the condenser end of the heat pipe. The port may include a metal filled elastomeric material. The elastic characteristic of the material may accommodate for tolerances in the system and insure contact between the material and the heat pipe. The metal filler provides a thermal path from the heat pipe to the manifold. The elastic port allows the heat pipe to be coupled to the manifold without any fasteners.

13 Claims, 2 Drawing Sheets

ELECTRONIC CARD WITH BLIND MATE HEAT PIPES

BACKGROUND OF THE INVENTION

1. Field of the Invention

The present invention relates to an electronic assembly which includes a heat pipe that transfers heat generated by an integrated circuit to a manifold of a cooling system.

2. Background Information

Integrated circuits are typically assembled into packages that are soldered to a printed circuit board. The printed circuit board may be the substrate of an electronic card that is plugged into a mating connector of a motherboard.

During operation the integrated circuit generates heat. The heat must be removed to insure that the junction temperatures of the circuit do not exceed an undesirable value. Some electronic cards incorporate heat slugs and heat sinks to facilitate the removal of heat from the circuit. The heat may flow into the ambient air from the heat slug/sink by forced or natural convection.

There have been developed electronic assemblies which integrate heat pipes to facilitate the removal of heat from the integrated circuit. Heat pipes typically include an outer tube that contains a wick and a fluid. The fluid absorbs heat and vaporizes at an evaporator end of the heat pipe. The evaporator end is thermally coupled to the integrated circuit. The gaseous fluid flows to a condenser end of the heat pipe where the heat is transferred from the pipe. The fluid changes back to the liquid phase in the condenser end and flows through the wick back to the evaporator end of the heat pipe to complete the cycle.

The condenser end of the heat pipe may be coupled to a "cold plate" such as a manifold of a cooling system. The condensor end is typically clamped or otherwise fastened to the cold plate to minimize the thermal impedance of the heat pipe/cold plate interface.

It is desirable to provide an electronic card that can be readily plugged into, and removed from, the motherboard of a system. For a card which has a clamped heat pipe, such a process would require the installation and/or removal of hardware that fastens the pipe to the cold plate. The existence of the clamping hardware requires tools and generally increases the time required to install and/or replace the card. It would be desirable to provide a system which allows a heat pipe of an electronic card to be coupled to a cold plate without any fasteners.

SUMMARY OF THE INVENTION

One embodiment of the present invention is an electronic assembly that includes a heat pipe which extends from an electronic card. The heat pipe has a condenser end that can be inserted into an elastic thermally conductive port of a manifold.

DETAILED DESCRIPTION

One embodiment of the present invention is an electronic assembly that includes a heat pipe that extends from an electronic card. The heat pipe has a condenser end that can be inserted into an elastic thermally conductive port of a manifold. The manifold may be part of a cooling system that removes heat from the condenser end of the heat pipe. The port may include a metal filled elastomeric material. The elastic characteristic of the material may compensate for tolerances in the system and insure contact between the material and the heat pipe. The metal filler provides a thermal path from the heat pipe to the manifold. The elastic port allows the heat pipe to be coupled to the manifold without any fasteners.

Figure 1:
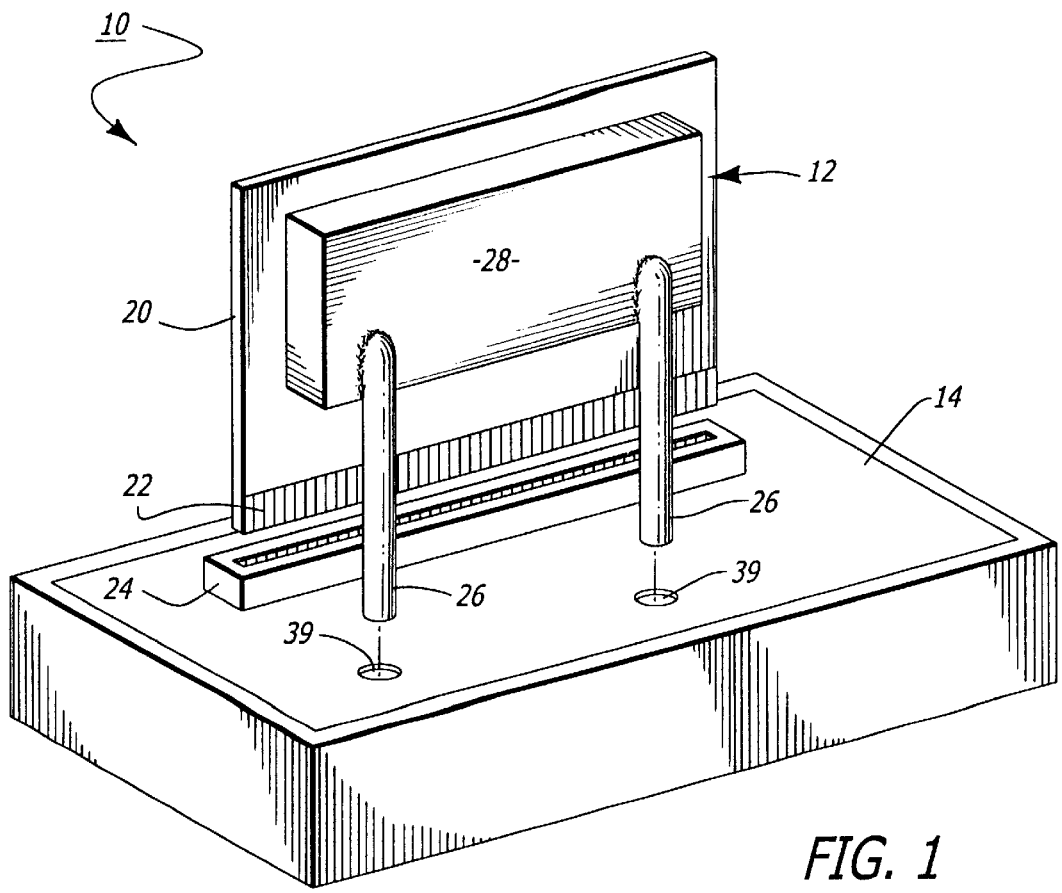
FIG. 1 is a perspective view of an embodiment of an electronic assembly of the present invention.
Figure 2:
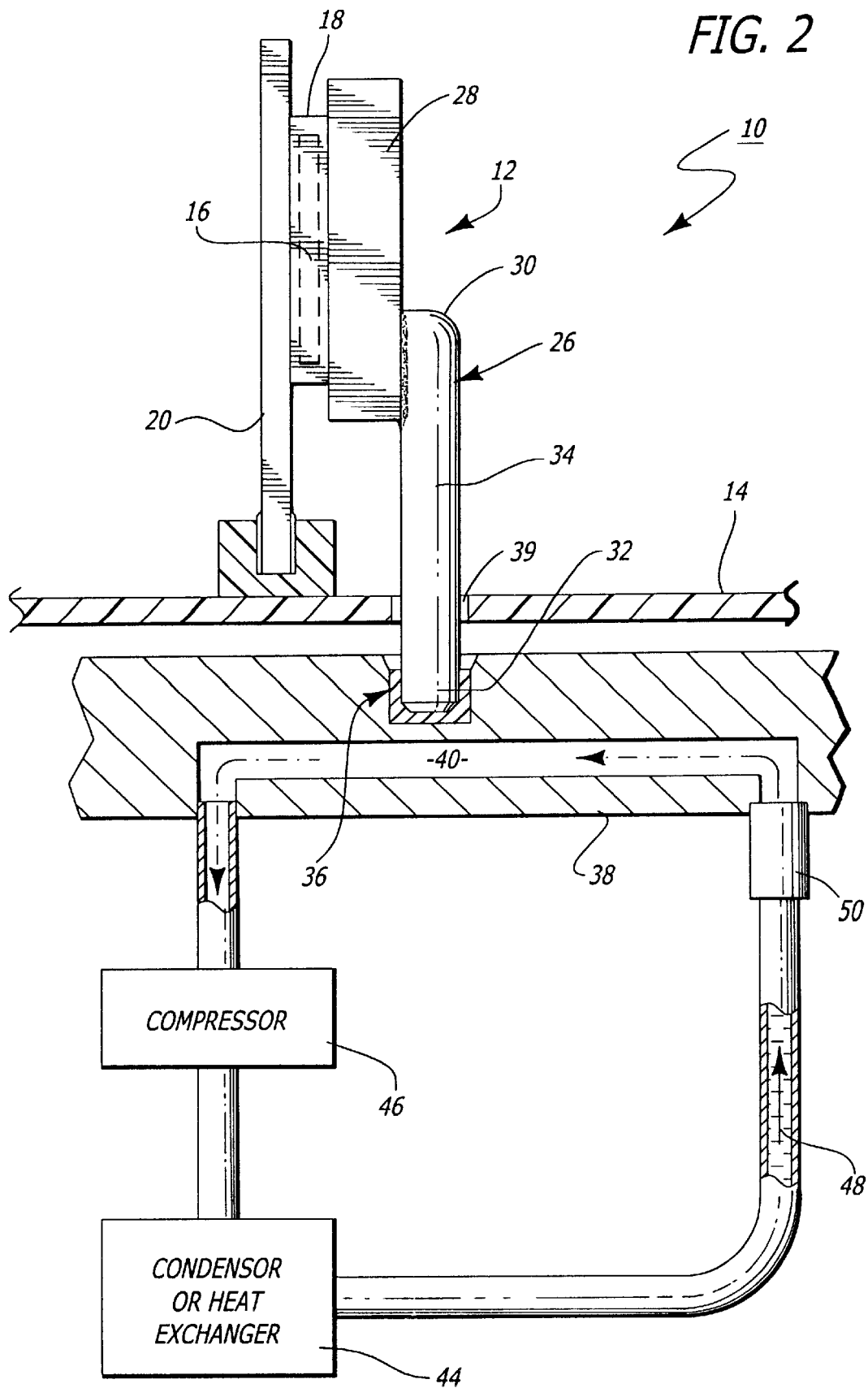
FIG. 2 is a side view of the electronic assembly.

Referring to the drawings more particularly by reference numbers, FIGS. 1 and 2 show an embodiment of an electronic assembly 10 of the present invention. The assembly 10 may include an electronic card 12 that is coupled to a printed circuit board 14. The printed circuit board 14 may be the motherboard of an electrical system such as a computer.

The electronic card 12 may include an integrated circuit 16 that is assembled into an integrated circuit package 18. The package 18 may be mounted to a printed circuit board 20. The printed circuit board 20 may have a plurality of contact pads 22 that can be inserted into an electrical connector 24 mounted to the motherboard 14. The package 18, contacts 22 and circuit board 20 electrically connect the integrated circuit 16 to the motherboard 14. Although a card edge type of connection is shown and described, it is to be understood that the card 12 may have other types of connectors such as pin and socket.

The electronic card 12 may include one or more heat pipes 26 that are coupled to a heat spreader 28. The heat spreader 28 is typically constructed from a thermally conductive material such as aluminum or copper and coupled to the integrated circuit package 18 so that heat flows from the integrated circuit 16 into an evaporator end 30 of the heat pipe 26. The heat is transferred by an internal heat pipe fluid (not shown) from the evaporator end 30 to a condenser end 32 of the pipe 26. The heat pipe 26 may include an outer tube 34 that is constructed from a thermally conductive material such as aluminum or copper.

The condenser end 32 of the heat pipe 26 can be inserted into an elastic thermally conductive port 36 of a manifold 38 through an opening 39 in the motherboard 14. The manifold 38 is typically constructed from a thermally conductive material such as aluminum or copper and may contain one or more internal channels 40.

Figure 3:
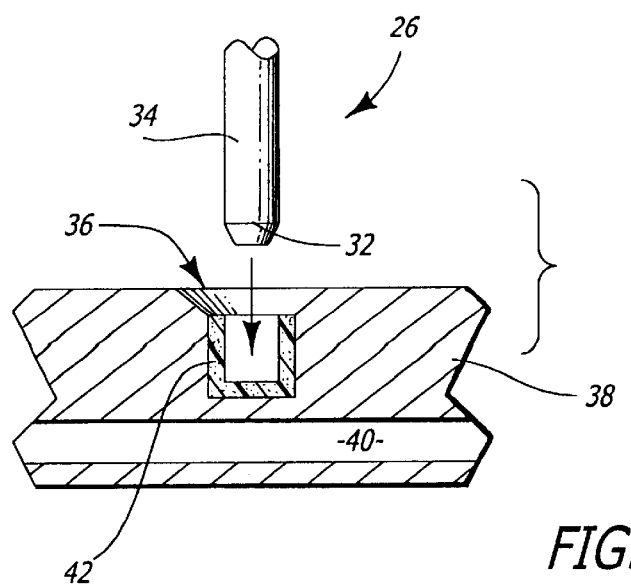
FIG. 3 is an enlarged side sectional view showing an elastic thermally conductive port that can receive a heat pipe.

As shown in FIG. 3, the port 36 may include a thermally conductive elastomeric material 42 that engages the outer tube 34. The material 42 may be a metal filled rubber material that is both elastic and thermally conductive. The elastomeric material 42 may have an inner diameter that is smaller than the outer diameter of the tube 34 so that the material 42 is deflected when the heat pipe 26 is inserted into the port 36. The elastic characteristic of the material 42 may compensate for tolerances in the system and insure that the elastic material 42 is always in contact with the heat pipe 26. The thermally conductive characteristic of the material provides a conductive path from the heat pipe 26 to the manifold 38. The elastic thermally conductive port 36 allows the heat pipe 26 to be coupled to the manifold 38 without using any fasteners.

Referring to FIG. 2, the manifold 38 may be coupled to a heat exchanger 44. The heat exchanger 44 and manifold 38 may be connected to a compressor 46 that pumps a cooling fluid 48 through the inner channel(s) 40. The manifold 38 may include a nozzle 50 or other element that allows liquid coolant to expand within the inner channel 40. Heat flows from the heat pipe 26, through the elastic thermally conductive material 42 and into the coolant 48 from the manifold 38. The coolant 48 may be compressed into a liquid state and pumped by the compressor 46 into the heat exchanger 44. The heat transfers from the heat exchanger 44 into the ambient air.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic assembly, comprising:

an electronic card which includes a heat pipe that has a condenser end, said heat pipe having a longitudinal axis; and, a manifold which has an elastic thermally conductive port that can receive said condenser end of said heat pipe, said elastic thermally conductive port applies a force on said heat pipe essentially perpendicular to the longitudinal axis of said heat pipe.

2. The assembly of claim 1, further comprising a motherboard that is coupled to said electronic card.

3. The assembly of claim 2, wherein said heat pipe extends through an opening of said motherboard.

4. The assembly of claim 1, further comprising a heat exchanger that is coupled to said manifold.

5. The assembly of claim 4, further comprising a compressor that is coupled to said heat exchanger and said manifold.

6. The assembly of claim 1, wherein said elastic thermally conductive port includes a metal filled elastomeric material.

7. An electronic assembly, comprising:

a manifold which has an elastic thermally conductive port;

a motherboard that is located adjacent to said manifold, said motherboard having an opening;

a connector mounted to said motherboard;

an electronic card which includes a substrate that is coupled to said connector, an integrated circuit package mounted to said substrate and a heat pipe that is coupled to said integrated circuit package, said heat pipe having a longitudinal axis and condenser end, that can be inserted through said motherboard opening and into said elastic thermally conductive port of said manifold, said elastic thermally conductive port applies a force on said heat pipe essentially perpendicular to the longitudinal axis of said heat pipe.

8. The assembly of claim 7, further comprising a heat exchanger that is coupled to said manifold.

9. The assembly of claim 8, further comprising a compressor that is coupled to said heat exchanger and said manifold.

10. The assembly of claim 7, wherein said elastic thermally conductive port includes a metal filled elastomeric material.

11. A method for installing an electronic card, comprising the steps of:

inserting a condensor end of a heat pipe of an electronic card into an elastic thermally conductive port of a manifold, such that the elastic thermally conductive port exerts a force on the heat pipe essentially perpendicular to a longitudinal axis of the heat pipe.

12. The method of claim 11, wherein a substrate of the electronic card is also inserted into a connector when the condenser end of the heat pipe is inserted into the elastic thermally conductive port.

13. The method of claim 11, further comprising the step of pumping a fluid through the manifold.

* * * * *